US006081581A

United States Patent [19]

Hasegawa

[11] Patent Number: 6,081,581

[45] Date of Patent: Jun. 27, 2000

[54] X-RAY ILLUMINATION SYSTEM AND X-RAY EXPOSURE APPARATUS

[75] Inventor: Takayuki Hasegawa, Utsunomiya, Japan

[73] Assignee: Canon Kabushiki Kaisha, Tokyo, Japan

[21] Appl. No.: 09/114,525

[22] Filed: Jul. 13, 1998

[30] Foreign Application Priority Data

| | | | |
|---|---|---|---|
| Jul. 11, 1997 | [JP] | Japan | 9-202207 |
| Jul. 11, 1997 | [JP] | Japan | 9-202545 |
| Jun. 18, 1998 | [JP] | Japan | 10-188274 |

[51] Int. Cl.[7] .......... G21K 1/00

[52] U.S. Cl. .......... 378/145; 378/34; 378/85; 378/205

[58] Field of Search .......... 378/34, 84, 85, 378/145, 146, 205, 206

[56] References Cited

U.S. PATENT DOCUMENTS

| | | | |
|---|---|---|---|
| 5,285,488 | 2/1994 | Watanabe et al. | 378/34 |
| 5,394,451 | 2/1995 | Miyake et al. | 378/34 |
| 5,448,612 | 9/1995 | Kasumi et al. | 378/84 |
| 5,835,560 | 11/1998 | Amemiya et al. | 378/34 |
| 5,930,324 | 7/1999 | Matsui et al. | 378/34 |
| 5,949,844 | 9/1999 | Wantanabe | 378/34 |

*Primary Examiner*—David P. Porta
*Assistant Examiner*—Allen C. Ho
*Attorney, Agent, or Firm*—Fitzpatrick, Cella, Harper & Scinto

[57] ABSTRACT

An X-ray illumination system includes first and second X-ray mirrors for reflecting a synchrotron radiation beam, sequentially, a driving system for changing at least one of position and attitude of each of the first and second X-ray mirrors, a first measuring system for detecting a synchrotron radiation beam impinging on the first X-ray mirror, a second measuring system for measuring at least one of position and attitude of the first X-ray mirror with respect to a predetermined reference, or at least one of relative position and relative attitude between the first and second X-ray mirrors, a first control system for controlling drive of the first X-ray mirror on the basis of the measurement by the first measuring system, and a second control system for controlling drive of the second X-ray mirror on the basis of the measurement by the second measuring system.

20 Claims, 12 Drawing Sheets

X-RAY ILLUMINATION SYSTEM AND X-RAY EXPOSURE APPARATUS

FIELD OF THE INVENTION AND RELATED ART

This invention relates to an X-ray exposure method for transferring and printing a mask pattern onto a substrate such as a wafer, for example. More particularly, the invention is concerned with an X-ray illumination system for use with synchrotron radiation light as exposure light, as well as an X-ray exposure apparatus or a device manufacturing method using such an X-ray illumination system.

Miniaturization of semiconductor device fine patterns has advanced with the enlargement of integration of the semiconductor device, and various exposure apparatuses capable of transferring and printing a pattern of a minimum line width of 0.15 micron for a DRAM of 1 gigabit or more have been developed. Among them, X-ray exposure apparatuses which use synchrotron radiation light from an electron accumulation ring as exposure light are attractive because of good printing precision and productivity.

X-ray exposure apparatuses using synchrotron radiation light as exposure light generally use an X-ray illumination system such as shown in FIG. 12 or 13.

In an X-ray illumination system shown in FIG. 12, denoted at 101 is a light source device which comprises an electron accumulation ring for producing sheet-like synchrotron radiation beam 102. Denoted at 103 is an X-ray mirror having a reflection surface being curved into a cylindrical shape. Denoted at 104 is an X-ray extracting window. Denoted at 105 is a mask or original having formed thereon a mask pattern which is to be transferred to a substrate such as a wafer, not shown. The sheet-like synchrotron radiation beam 102 emitted from the light source device 101, comprising an electron accumulation ring, is expanded by the X-ray mirror 103 with respect to the Y direction. The synchrotron radiation beam 102 thus expanded into a required exposure picture angle goes through the X-ray extracting window 104 and enters an exposure chamber on the exposure apparatus side. Then, it illuminates the whole surface of the mask 105 at once, whereby the mask pattern is transferred to the substrate (wafer). In such an X-ray illumination system, the synchrotron radiation beam is projected onto the mask surface without being collected or converged. By the way, if relative position of the reflection surface of the X-ray mirror 103 and the synchrotron radiation beam 102, that is, the incidence position of the synchrotron radiation beam 102, shifts in the Y direction, it causes a change in the intensity distribution of the expanded synchrotron radiation beam which then produces large non-uniformness of intensity within the exposure picture angle. This prevents uniform exposure. In consideration of it, a synchrotron radiation beam position sensor 107 is mounted on a mirror holding portion 106 to detect relative positional deviation in the Y direction of the synchrotron radiation beam 102, impinging on the X-ray mirror 103. Also, mirror driving means 108 for moving the X-ray mirror 103 in the Y direction as well as control means 109 are provided. The control means 109 serves to calculate relative positional deviation between the X-ray mirror 103 and the synchrotron radiation beam 102 on the basis of a detection output of the synchrotron radiation beam position sensor 107. Also, it serves to drive control the mirror driving means 108 on the basis of the result of calculation, to prevent relative shift of the center of the intensity distribution of the synchrotron radiation beam 102 with respect to the Y direction, from a predetermined position upon the mirror reflection surface.

Also, in an X-ray illumination system shown in FIG. 13, denoted at 201 is a light source device which comprises an electron accumulation ring for producing sheet-like synchrotron radiation beam 202. Denoted at 203 is an X-ray mirror being mounted swingable through a swinging mechanism, not shown. Denoted at 204 is an X-ray extracting window. Denoted at 205 is a mask or original having formed thereon a mask pattern which is to be transferred to a substrate such as a wafer, not shown. The X-ray mirror 203 is swingingly moved in the wX direction by the unshown swinging mechanism, with which the sheet-like synchrotron radiation beam 202 is scanningly deflected in the Y direction. The sheet-like synchrotron radiation beam 202 then goes through the X-ray extracting window 204 and enters an exposure chamber on the exposure apparatus side. Thus, it illuminates the whole surface of the mask 205.

A synchrotron radiation beam position sensor 207 is mounted on a mirror holding portion 206 to detect relative positional deviation in the Y direction of the synchrotron radiation beam 202, impinging on the X-ray mirror 203. Also, mirror driving means 208 for moving the swinging center of the X-ray mirror 203 in the Y direction as well as control means 209 are provided. The control means 209 serves to calculate relative positional deviation between the X-ray mirror 203 and the synchrotron radiation beam 202 on the basis of a detection output of the synchrotron radiation beam position sensor 207. Also, it serves to drive control the mirror driving means 208 on the basis of the result of calculation, to prevent relative shift of the center of the intensity distribution of the synchrotron radiation beam 202 with respect to the Y direction, from a predetermined position upon the mirror reflection surface and thereby to prevent a change in X-ray intensity distribution upon the mask 205.

In the X-ray illumination systems described above, control is made so as to prevent shift of the center of the intensity distribution of the synchrotron radiation beam with respect to the Y direction, relative to the X-ray mirror reflection surface. This is because of the reasons that: in an X-ray illumination system wherein no light collection is performed, the X-ray mirror reflection surface is flat with respect to the X direction, such that a deviation between the synchrotron radiation beam and the mirror reflection surface with respect to the X direction does not produce a change in X-ray intensity upon the mask surface and a deviation in the wY direction produces a small effect; whereas a deviation in the Y direction between the synchrotron radiation beam and the X-ray mirror reflection surface causes a large change in X-ray intensity to be projected on the mask. Namely, if the relative position of the X-ray mirror and the synchrotron radiation beam changes in the Y direction, it causes a large change in intensity distribution of the synchrotron radiation beam and large non-uniformness of intensity within the exposure picture angle. This prevents uniform exposure. In consideration of it, the mirror driving means is controlled to move and adjust the X-ray mirror in accordance with an output of the synchrotron radiation beam position sensor, so as to avoid relative shift of the center of the intensity distribution of the synchrotron radiation beam in the Y direction from a predetermined position on the X-ray mirror reflection surface.

In recent X-ray illumination systems, a synchrotron radiation beam is collected and also expanded or scanningly deflected, so that an X-ray beam of higher intensity can be supplied to an exposure apparatus for exposure of the whole mask surface. In such X-ray illumination systems, at least two X-ray mirrors are used to enable mask exposure with higher intensity X-rays and to ensure reduction of exposure time, thereby to improve the throughput of the exposure apparatus.

SUMMARY OF THE INVENTION

In an X-ray illumination system having at least two X-ray mirrors for collecting a synchrotron radiation beam in the X direction and for expanding or scanningly deflecting it in the Y direction, as described above, however, uniform X-ray intensity distribution cannot be assured with mere adjustment of the X-ray mirror position based on detection of the incidence position of the synchrotron radiation beam in the Y direction such as described above. This is because: in a light collection X-ray illumination system, the reflection surface of the X-ray mirror has a curvature in the X direction and, specifically, the surface is concave in the X direction, such that a deviation between the synchrotron radiation beam and the X-ray mirror reflection surface with respect to a direction other than the Y direction produces two-dimensional shift of the X-ray intensity distribution upon the mask surface. More specifically, with an X-ray mirror having a concave surface, if the beam incidence position deviates in the X direction or if the optical axis of the beam tilts, it causes a large change in reflection angle of the X-ray mirror which produces two-dimensional shift of X-ray intensity distribution within the exposure picture angle. Therefore, with respect to each of the X-ray mirrors used, not only a deviation between the synchrotron radiation beam and the X-ray mirror in the Y direction but also a deviation therebetween in any other direction produces a nonuniform X-ray intensity distribution on the mask surface.

In the X-ray illumination systems described above, a shift of the optical axis of the synchrotron radiation beam in a direction other than the Y direction cannot be detected. Thus, a high intensity and uniform X-ray beam cannot be supplied to an exposure apparatus, and sufficient transfer precision is not assured.

It is accordingly an object of the present invention to provide an X-ray illumination system by which a relative deviation between an X-ray mirror and an optical axis of a synchrotron radiation beam can be detected and the position or attitude of the X-ray mirror can be controlled, by which an X-ray beam of a higher intensity and uniform intensity distribution can be supplied to an exposure apparatus.

It is another object of the present invention to provide an X-ray exposure apparatus having such an X-ray illumination system.

It is a further object of the present invention to provide a device manufacturing method which uses such an X-ray illumination system or an X-ray exposure apparatus described above.

In accordance with an aspect of the present invention, there is provided an X-ray illumination system, comprising: first and second X-ray mirrors for reflecting a synchrotron radiation beam, sequentially; driving means for changing at least one of position and attitude of each of said first and second X-ray mirrors; first measuring means for detecting a synchrotron radiation beam impinging on said first X-ray mirror; second measuring means for measuring at least one of position and attitude of said first X-ray mirror with respect to a predetermined reference, or at least one of relative position and relative attitude between said first and second X-ray mirrors; first control means for controlling drive of said first X-ray mirror on the basis of the measurement by said first measuring means; and second control means for controlling drive of said second X-ray mirror on the basis of the measurement by said second measuring means.

In accordance with another aspect of the present invention, there is provided an X-ray exposure apparatus, comprising: an X-ray illumination system as recited above, and means for holding an article to be exposed with X-rays supplied by said X-ray illumination system.

In accordance with a further aspect of the present invention, there is provided a method of illuminating an object with a synchrotron radiation beam reflected by first and second X-ray mirrors sequentially, said method comprising: a first step for maintaining at least one of position and attitude of the first X-ray mirror against a displacement of the synchrotron radiation beam; and a second step for shifting the second X-ray mirror to follow a shift of the first X-ray mirror produced in the maintaining step.

In accordance with a yet further aspect of the present invention, there is provided a device manufacturing method for producing a device through a procedure which includes a process for exposing a substrate through an X-ray illumination method as recited above.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will be described with reference to the drawings.

First Embodiment

Figure 1:
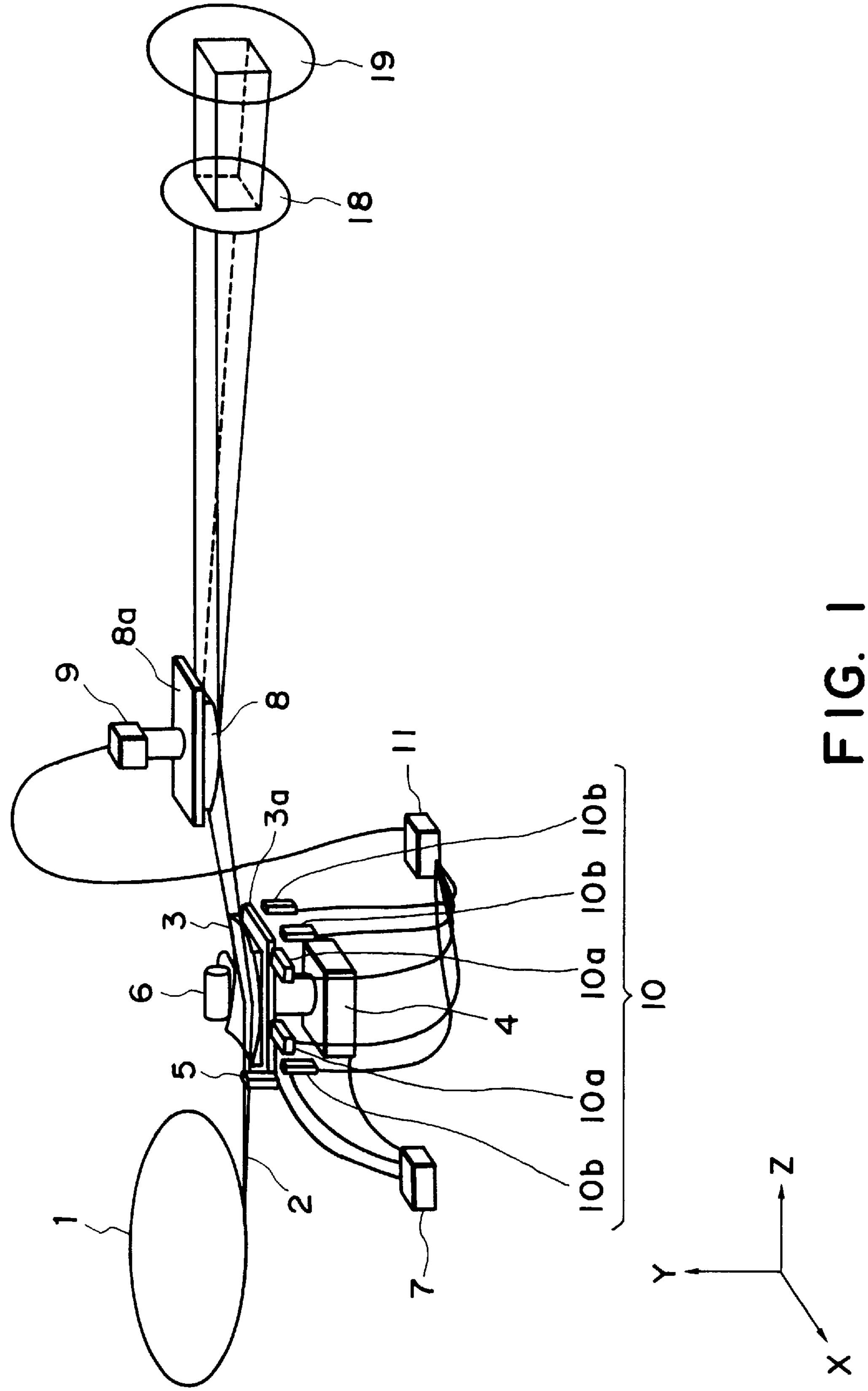
FIG. 1 is a schematic view of an X-ray illumination system according to a first embodiment of the present invention.

FIG. 1 is a schematic view of an X-ray illumination system according to a first embodiment of the present invention, which uses at least two X-ray mirrors. The illustrated X-ray illumination system uses two X-ray mirrors wherein a first X-ray mirror serves to collect a synchrotron radiation in an X direction while a second X-ray mirror expands the synchrotron radiation beam in a Y direction, for simultaneous exposure of the whole surface of a mask (original).

Figure 2:
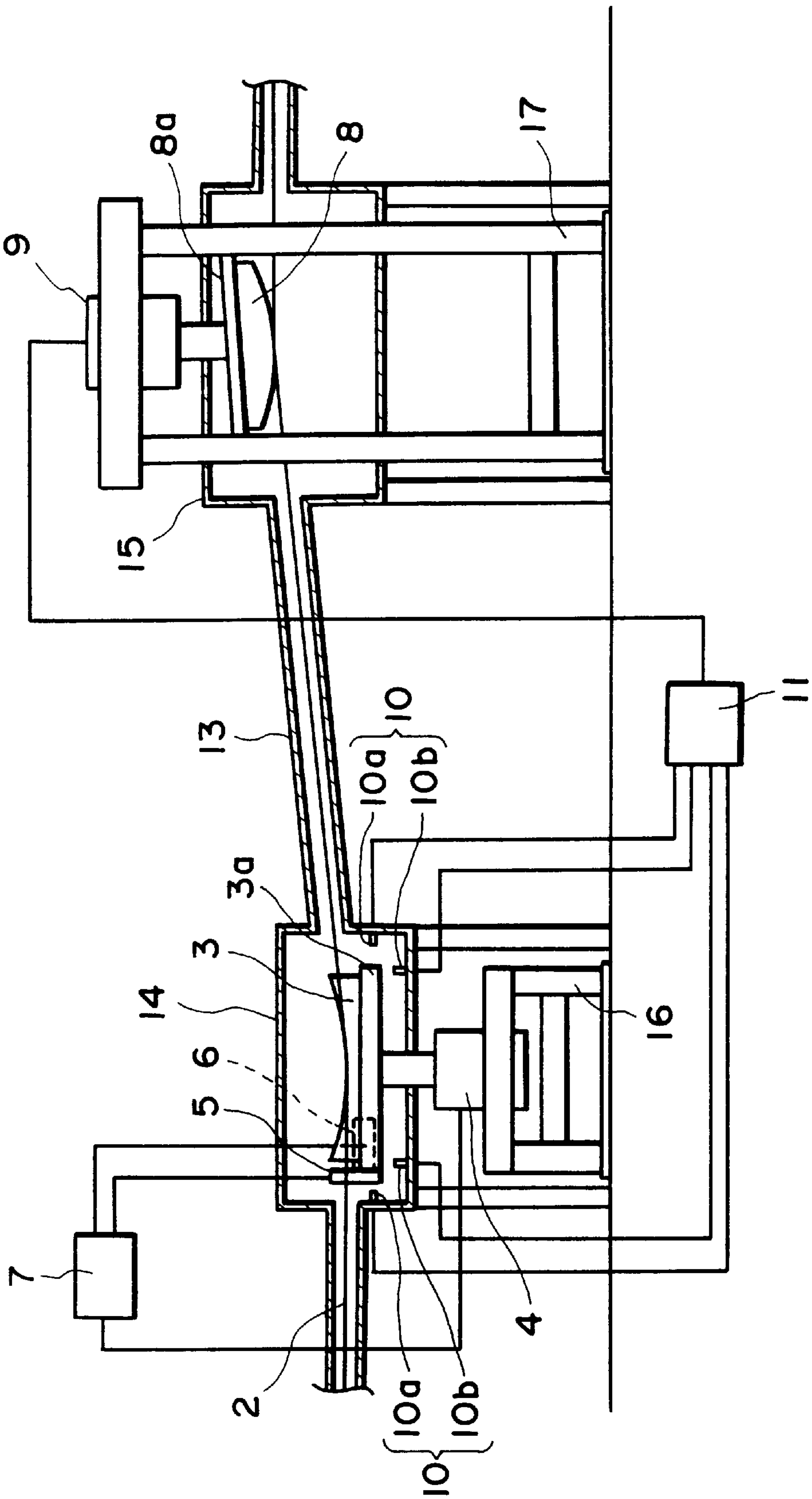
FIG. 2 is a schematic and side view, showing partly in section the X-ray illumination system of the first embodiment.

Denoted in FIG. 1 at 1 is a light source of an X-ray exposure system which comprises an electron accumulation ring for accumulating electrons and emitting a synchrotron radiation beam. It produces a sheet-like synchrotron radiation beam 2. The sheet-like synchrotron radiation beam 2 is collected or converged in the X direction by a first X-ray mirror 3 which is a light collecting mirror having a reflection surface being shaped concaved both in the X direction and Y direction. The synchrotron radiation beam 2 collectively reflected by the first X-ray mirror 3 is then reflected and expanded in the Y direction by a second X-ray mirror 8 which is an expanding mirror having a reflection surface curved convexed both in the X direction and the Y direction. The synchrotron radiation beam 2 is thus collected and expanded by the X-ray illumination system having first and second mirrors, as described. It is then transmitted through a beryllium window 18 which is an X-ray extracting window for isolating ultra-high vacuum ambience and X-ray exposure ambience, and it is introduced into an exposure chamber to illuminate an X-ray mask 19 (original) which is demountably mounted on a mask stage, not shown. In response, a circuit pattern formed on the X-ray mask 19 is lithographically transferred to a substrate (not shown) such as a wafer, for example, which is held by substrate holding means such as a wafer stage, for example. The synchrotron radiation beam 2 emitted from the electron accumulation ring 1 goes along a beam line 13 (FIG. 2) with ultra-high vacuum ambience kept therein up to the beryllium window 18. The first and second X-ray mirrors 3 and 8 are disposed inside ultra-high vacuum chambers 14 and 15, respectively.

The first X-ray mirror 3 which is a light collecting mirror is held by a first mirror holder 3*a*, and the position or attitude thereof can be adjusted by first driving means 4 which is connected to first control means 7. There are an intensity sensor 5 for detecting an intensity center of the synchrotron radiation beam 2 and an optical axis sensor 6 for detecting tilt of an optical axis of the synchrotron radiation beam 2. These sensors are mounted on the first mirror holder 3*a* in a predetermined positional relation with the first X-ray mirror. The intensity sensor 5 and the optical axis sensor 6 serve to detect relative position and relative angle of the sheet-like synchrotron radiation beam 2 with respect to the first X-ray mirror 3, and they produce corresponding detection signals and apply them to the first control means 7. On the basis of these signals, the first control means 7 calculates a relative positional deviation between the first X-ray mirror 3 and the sheet-like synchrotron radiation beam 2, and produces and applies a signal to the first driving means 4 in accordance with the result of the calculation. By this, the first X-ray mirror 3 and the synchrotron radiation beam 2 can be maintained in a predetermined positional relation with each other.

The second X-ray mirror 8 for reflecting and expanding in the Y direction the synchrotron radiation beam 2 having been collectively reflected by the first X-ray mirror 3, is held by a second mirror holder 8*a*, as the first X-ray mirror 3, and the position or attitude thereof can be adjusted by second driving means 9.

Inside the ultra-high vacuum chamber 14 for accommodating the first X-ray mirror 3, there is position/attitude measuring means 10 for measuring a change in position and/or attitude of the first X-ray mirror 3 with respect to a predetermined reference plane (predetermined reference). The position/attitude measuring means 10 comprises a plurality of sensors 10*a*, 10*a*, . . . , fixedly mounted on a side wall of the ultra-high vacuum chamber 14, and a plurality of sensors 10*b*, 10*b*, . . . , fixedly mounted on a bottom wall thereof. It serves to measure a change in position and/or attitude of the first X-ray mirror 3 with respect to the floor surface, with the floor surface being used as a reference plane. Second control means 11 is connected to the position/attitude measuring means 10, and it serves to calculate a displacement of an optical axis, at the second X-ray mirror 8 position, of the synchrotron radiation beam as reflected by the first X-ray mirror 3, on the basis of a measured value of displacement of the first X-ray mirror 3 as measured by the position/attitude measuring means 10. Also, the second control means 11 serves to calculate a drive amount of the second X-ray mirror 8 to be provided with respect to the optical axis of the synchrotron radiation beam, and then to control the second driving means 9 in accordance with the calculated drive amount. By this, the position or attitude of the second X-ray mirror can follow displacement of the first X-ray mirror.

Figure 3A:
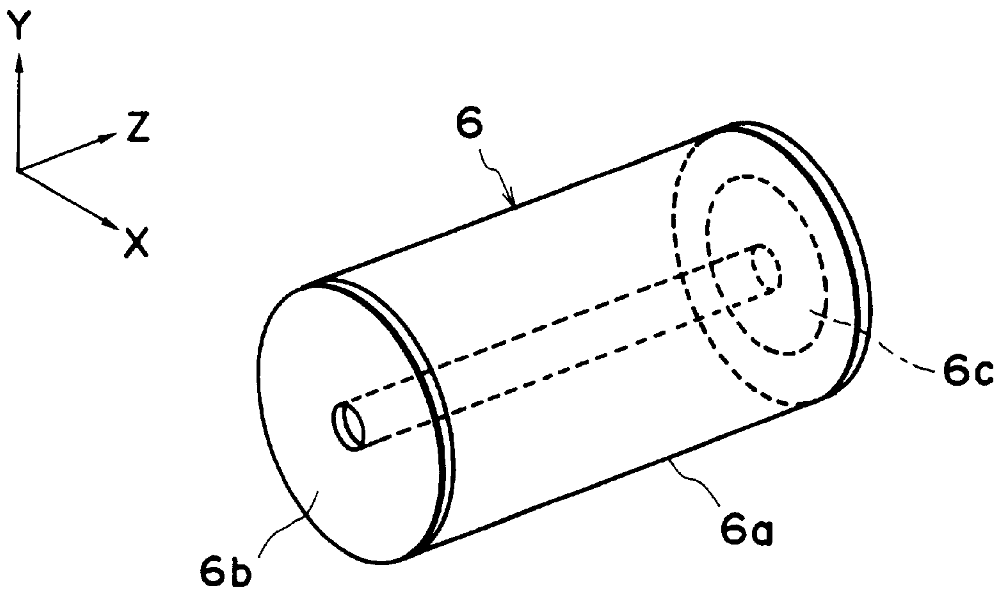
FIGS. 3A and 3B are schematic views, respectively, for explaining an intensity sensor and an optical axis sensor, respectively, mounted in relation to a first X-ray mirror for detecting intensity and optical axis of a synchrotron radiation beam.

Next, a description will be made of the intensity sensor 5 and the optical axis sensor 6 which are fixedly mounted on the first mirror holder 3*a*, for detecting the intensity center and tilt of optical axis of the synchrotron radiation beam 2, impinging on the first X-ray mirror 3. The optical axis sensor 6 comprises, as shown in FIG. 3A, a cylindrical frame 6*a*, a pinhole member 6*b* fixed to one end of the frame 6*a*, and an X-ray area sensor 6*c* held at the other end of the frame 6*a*. It is fixedly mounted on the mirror holder 3*a* of the first X-ray mirror 3, at a position on the first X-ray mirror 3 where the synchrotron radiation beam 2 is to be projected on. As the synchrotron radiation beam 2 is projected on the first X-ray mirror 3, the beam simultaneously impinges on the optical axis sensor 6 such that the synchrotron radiation beam passing through the pinhole member 6*b* impinges on the X-ray area sensor 6*c*. Thus, a shift of the optical axis of the synchrotron radiation beam can be measured as a shift of position of a spot on the X-ray area sensor 6*c*. From the amount of this shift and from the distance between the pinhole member 6*b* and the X-ray area sensor 6*c*, tilt of the optical axis of the synchrotron radiation beam can be calculated. Also, from this tilt of the optical axis, displacements of the synchrotron radiation beam with respect to the X direction, wX direction and wY direction can be calculated. While this embodiment uses an X-ray area sensor as the optical axis sensor 6, any other sensor such as a quadrant sensor, for example, may be used provided that the position of an X-ray spot can be measured therewith.

Figure 3B:
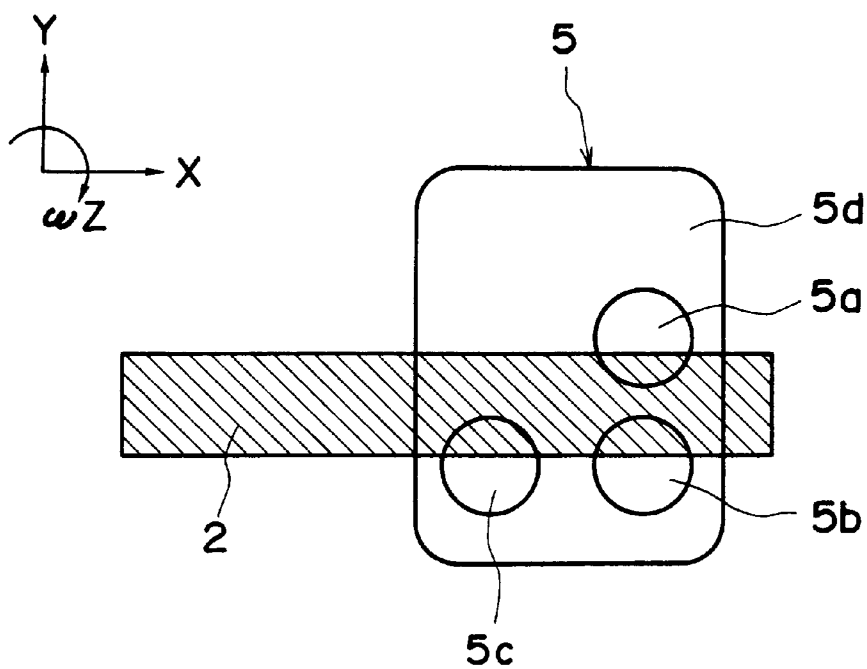

As shown in FIG. 3B, the intensity sensor 5 comprises a casing 5*d* having three X-ray sensors 5*a*–5*c* accommodated as a unit. The first and second X-ray sensors 5*a* and 5*b* are disposed in an array along the Y direction, and the third X-ray sensor 5*c* is disposed in the array with the second X-ray sensor in X direction. Thus, in response to impingement of the sheet-like synchrotron radiation beam 2 upon the intensity sensor 5, from the sum of and difference between intensities as detected by the first and second X-ray intensity sensors 5*a* and 5*b*, the center of the synchrotron radiation beam 2 with respect to the Y direction can be calculated. Also, from the ratio of intensities as detected by the second and third X-ray intensity sensors 5*b* and 5*c*, displacement of the synchrotron radiation beam 2 in the wZ direction can be calculated.

With the arrangement described above, the sheet-like synchrotron radiation beam 2 emitted from the electron accumulation ring 1 impinges on the first X-ray mirror 3 and, simultaneously therewith, it impinges on the intensity sensor 5 and the optical axis sensor 6. By the intensity sensor 5 and the optical axis sensor 6, displacement of the synchrotron radiation beam 2 impinging on the first X-ray mirror 3 with respect to the X direction, the Y direction, wX direction, wY direction and wZ direction can be detected. All measured values are supplied to the first control means 7. On the basis of these measured values, the first control means 7 calculates drive amounts in relation to these axes of the first driving means 4, and controls the position and attitude of the first X-ray mirror 3 with respect to the synchrotron radiation beam 2. By this, relative positional deviation between the first X-ray mirror 3 and the synchrotron radiation beam 2 can be avoided.

Control of the position and attitude of the second X-ray mirror 8 can be performed by measuring a change in position and attitude of the first X-ray mirror 3 with respect to the floor surface (reference plane) by using the position/attitude measuring means 10 which is disposed inside the ultra-high vacuum chamber 14 for accommodating the first X-ray mirror 3 therein. More specifically, on the basis of the result of measurement of the position and attitude of the first X-ray mirror 3 with respect to the floor surface (reference plane) through the position/attitude measuring means 10, the second control means 11 calculates the synchrotron radiation beam optical axis 2, at the second X-ray mirror 8 position, having been reflected by the first X-ray mirror 3. Also, it calculates a drive amount for the second X-ray mirror 8 with respect to the optical axis of the synchrotron radiation beam 2. On the basis of the thus calculated drive amount, the second control means controls the second driving means 9 to move and adjust the second X-ray mirror 8. With this adjustment, even if there occurs a change in positional relation between the second X-ray mirror 8 and the optical axis of the synchrotron radiation beam 2 reflected by the first X-ray mirror 3 as a result of adjustment of the first X-ray mirror to meet fluctuation of synchrotron radiation beam 2 or of a shift of the first X-ray mirror itself for any reason, the position and attitude of the second X-ray mirror can be adjusted promptly with respect to the optical axis of the synchrotron radiation beam 2.

In accordance with the X-ray illumination system of this embodiment, the intensity sensor 5 and the optical axis sensor 6 are fixedly provided at the first X-ray mirror 3 side and they detect the optical axis of the synchrotron radiation beam 2 at the first X-ray mirror position. On the basis of the result of detection by these sensors, the first X-ray mirror 3 is drive controlled so that it is maintained at a predetermined position and attitude constantly with respect to the optical axis of the synchrotron radiation beam 2. Further, the position/attitude measuring means 10 measures the position and attitude of the first X-ray mirror 3 and, on the basis of the result of the measurement, a drive amount of the second X-ray mirror 8 is calculated. By this, the position and attitude of the second X-ray mirror can be controlled to follow displacement of the first X-ray mirror.

Thus, without provision of an intensity sensor or optical axis sensor for the second X-ray mirror 8, both the first X-ray mirror 3 and the second X-ray mirror 8 can be positioned precisely with respect to the synchrotron radiation beam 2. Therefore, a relative positional deviation between the first or second X-ray mirror and the synchrotron radiation beam impinging thereto can be avoided. Additionally, as the floor is used as a reference plane for measurement of the position and attitude of the first X-ray mirror through the position/attitude measuring means 10, precision registration of all X-ray mirrors with the optical axis of the synchrotron radiation beam is assured with a simple structure.

Since all the X-ray mirrors can be precisely positioned with respect to the synchrotron radiation beam, uniform and collected illumination light with less non-uniformness of intensity can be supplied to the whole surface within an exposure picture angle of the exposure apparatus simultaneously. Thus, exposure of less non-uniformness is assured. Improvement of the transfer precision of the X-ray exposure apparatus as well as a large increase of throughput are attainable.

Second Embodiment

A second embodiment of the present invention will be described with reference to FIG. 4. This embodiment has an arrangement, in addition to the structure of the first embodiment, that a shift of relative position of the first X-ray mirror, due to floor vibration, for example, at respective X-ray mirror positions can be corrected. In this embodiment, the components similar to those of the first embodiment are denoted by corresponding reference numerals.

Figure 4:
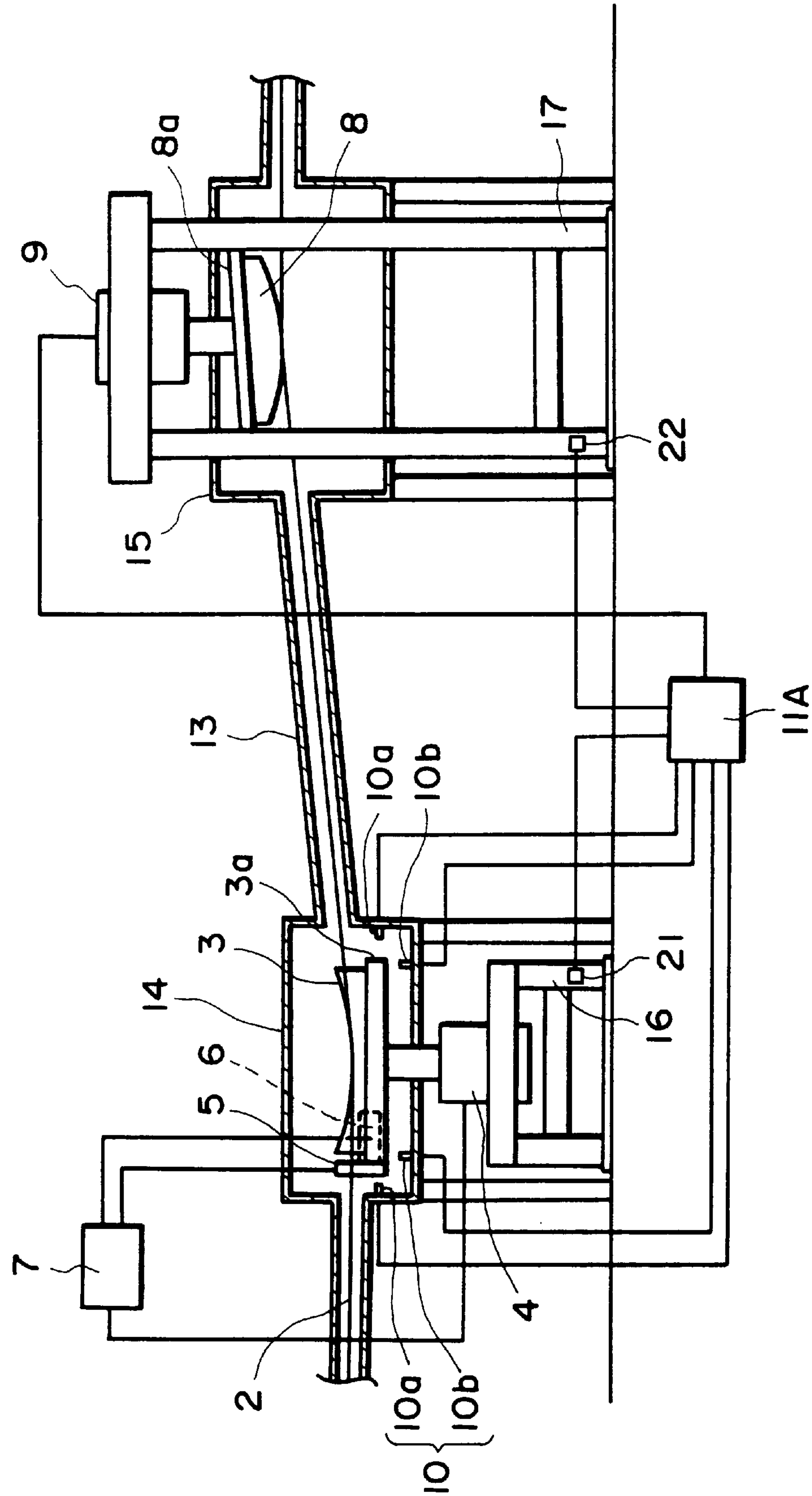
FIG. 4 is a schematic and side view, showing partly in section an X-ray illumination system according to a second embodiment of the present invention.

Denoted in FIG. 4 at 21 is floor vibration measuring means for measuring floor vibration at the first X-ray mirror position. It is fixedly mounted on a frame 16 for supporting the first X-ray mirror 3 and being disposed on the floor surface. Denoted at 22 is floor vibration measuring means for measuring floor vibration at the second X-ray mirror position. It is fixedly mounted on a frame 17 for supporting the second X-ray mirror 8 and being disposed on the floor surface. This embodiment uses second control means 11A, in place of the second control means 11 of the first embodiment. More specifically, the second control means 11A drive controls the second driving means 9 for the second X-ray mirror 8, and it receives a measurement signal from the position/attitude measuring means 10 disposed inside the ultra-high vacuum chamber 14 for the first X-ray mirror 3 and for measuring the position and attitude of the first X-ray mirror 3. In addition to this, it receives measurement signals from the two floor vibration measuring means for measuring floor vibrations at the positions of the first and second X-ray mirrors 3 and 8, respectively. On the basis of theses measurement signals, the second control means calculates relative positional displacements of the first and second X-ray mirrors 3 and 8, due to floor vibration, for example. Thus, the second control means 11A calculates the optical axis, at the second X-ray mirror 8 position, of the synchrotron radiation beam 2 having been reflected by the first X-ray mirror 3, and also calculates a drive amount for the second X-ray mirror 8 with respect to the optical axis of the synchrotron radiation beam 2. Further, it calculates relative positional deviations at respective positions from the outputs of the two floor vibration measuring means 21 and 22, and calculates deviation of the second X-ray mirror 8 relative to the first X-ray mirror 3, on the basis of which it corrects the drive amount for the second X-ray mirror 8 based on the result of measurement by the position/attitude measuring means 10. In accordance with the thus corrected drive amount, the second control means actuates the second driving means 9.

With this arrangement, in addition to the advantageous effects of the first embodiment, a relative positional displacement between the first and second X-ray mirrors can be measured, and the drive amount for the second X-ray mirror 8 can be corrected. Thus, even if the relative position of the first and second X-ray mirrors 3 and 8 shifts due to floor vibration, for example, the first and second X-ray mirrors 3 and 8 can be positioned precisely with respect to the synchrotron radiation beam.

The floor vibration measuring means may include an acceleration sensor, for example, for calculating amplitude from measured acceleration. Alternatively, a distance measuring sensor may be disposed in the atmosphere of the first X-ray mirror unit while a target is fixedly provided in the atmosphere of the second X-ray mirror unit, such that relative shift of the second X-ray mirror unit relative to the first X-ray mirror unit may be measured directly. Any other method may be used as the floor vibration measuring means, provided that it can measure relative positional shift of the first and second X-ray mirrors due to floor vibration.

Third Embodiment

A third embodiment of the present invention will be described with reference to FIG. 5. Although this embodiment is directed to an X-ray illumination system which uses at least two X-ray mirrors, like the first embodiment, in this embodiment, the synchrotron radiation beam is collected in the X direction, while the sheet-like synchrotron radiation beam is scanningly deflected in the Y direction through swinging motion of at least one X-ray mirror with a swinging mechanism, to relatively scan the X-rays relative to the exposure picture angle for illumination of the whole mask surface. Like numerals as those the first embodiment are assigned to corresponding elements of this embodiment.

Figure 5:
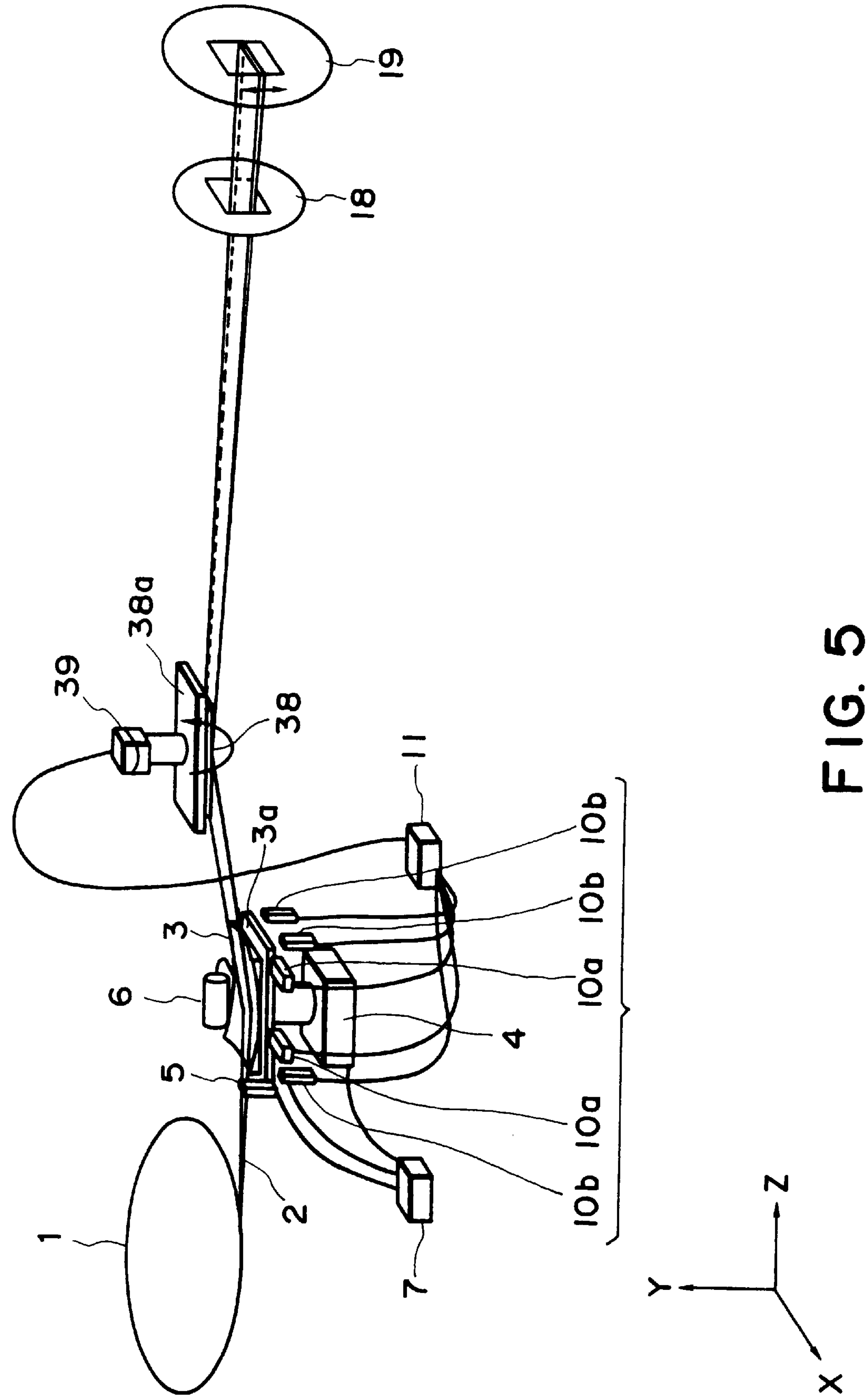
FIG. 5 is a schematic view of an X-ray illumination system according to a third embodiment of the present invention.

Denoted in FIG. 5 at 38 is a scan mirror which is the second X-ray mirror. It can be swingingly moved in the wX direction by a swinging mechanism, not shown, so that the synchrotron radiation beam 2 having been collectively reflected by the first X-ray mirror 3 is scanningly deflected in the Y direction. The second X-ray mirror 38 is held by a second mirror holder 38*a*, and the position or attitude thereof can be adjusted by second driving means 39. Here, control should be made so that the center of swinging motion of the second X-ray mirror during a scanning exposure operation is held at a predetermined position and attitude with respect to the synchrotron radiation beam 2. To this end, the unshown swinging mechanism may preferably be disposed on the second driving means 39, so that the second driving means 39 may control the center of swinging motion by the swinging mechanism to a predetermined position or attitude with respect to the synchrotron radiation beam 2.

Like the first embodiment described hereinbefore, the collecting mirror 3 which is the first X-ray mirror is held by a first mirror holder 3*a*, and the position or attitude thereof can be adjusted by first driving means 4 which is connected to first control means 7. There are an intensity sensor 5 for detecting an intensity center of the synchrotron radiation beam 2 and an optical axis sensor 6 for detecting tilt of an optical axis of the synchrotron radiation beam 2. These sensors are mounted on the first mirror holder 3*a* in a predetermined positional relation with the first X-ray mirror. The intensity sensor 5 and the optical axis sensor 6 serve to detect relative position and relative angle of the sheet-like synchrotron radiation beam 2 with respect to the first X-ray mirror 3, and they produce corresponding detection signals and apply them to the first control means 7. On the basis of these signals, the first control means 7 calculates a relative positional deviation between the first X-ray mirror 3 and the sheet-like synchrotron radiation beam 2, and produces and applies a signal to the first driving means 4 in accordance with the result of the calculation. By this, the first X-ray mirror 3 and the synchrotron radiation beam 2 can be maintained in a predetermined positional relation with each other.

Like the first embodiment described, there is position/attitude measuring means 10, comprising sensors 10*a*, 10*a*, . . . , and 10*b*, 10*b*, . . . , for measuring a change in position and/or attitude of the first X-ray mirror 3, provided in relation to the first X-ray mirror 3. Second control means 11 serves to calculate the optical axis, at the second X-ray mirror 38 position, of the synchrotron radiation beam as reflected by the first X-ray mirror 3, on the basis of a measured value of displacement of the first X-ray mirror 3 as measured by the position/attitude measuring means 10. Also, the second control means 11 serves to calculate a drive amount of the second X-ray mirror 38 to be provided with respect to the optical axis of the synchrotron radiation beam, and then to control the second driving means 39 in accordance with the calculated drive amount.

In accordance with the X-ray illumination system of this embodiment, like the first embodiment of the present invention described above, the intensity sensor 5 and the optical axis sensor 6 are fixedly provided at the first X-ray mirror 3 side and they detect the optical axis of the synchrotron radiation beam 2 at the first X-ray mirror position. On the basis of the result of detection by these sensors, the first X-ray mirror 3 is drive controlled so that it is maintained at a predetermined position and attitude constantly with respect to the optical axis of the synchrotron radiation beam 2. Further, the position/attitude measuring means 10 measures the position and attitude of the first X-ray mirror 3 and, on the basis of the result of the measurement, a drive amount of the second X-ray mirror 48 is calculated and the second driving means 49 is actuated. By this, the position and attitude of the second X-ray mirror 48 can be controlled to follow displacement of the first X-ray mirror.

Thus, in this embodiment, like the first embodiment, without provision of an intensity sensor or optical axis sensor for the second X-ray mirror 48, both the first X-ray mirror 3 and the second X-ray mirror 48 can be positioned precisely with respect to the synchrotron radiation beam 2. Therefore, a relative positional deviation between the first or second X-ray mirror and the synchrotron radiation beam impinging thereto can be avoided. Additionally, as the floor is used as a reference plane for measurement of the position and attitude of the first X-ray mirror through the position/attitude measuring means 10, precision registration of all X-ray mirrors with the optical axis of the synchrotron radiation beam is assured with a simple structure.

All the X-ray mirrors can be precisely positioned with respect to the synchrotron radiation beam, and at least one X-ray mirror can be swingingly moved to scanningly deflect the sheet-like synchrotron radiation beam. Thus, the whole mask surface can be scanned with collected and higher intensity illumination light with less non-uniformness of intensity, and improvement of the transfer precision of the X-ray exposure apparatus as well as a large increase of throughput are assured.

Fourth Embodiment

Figure 6:
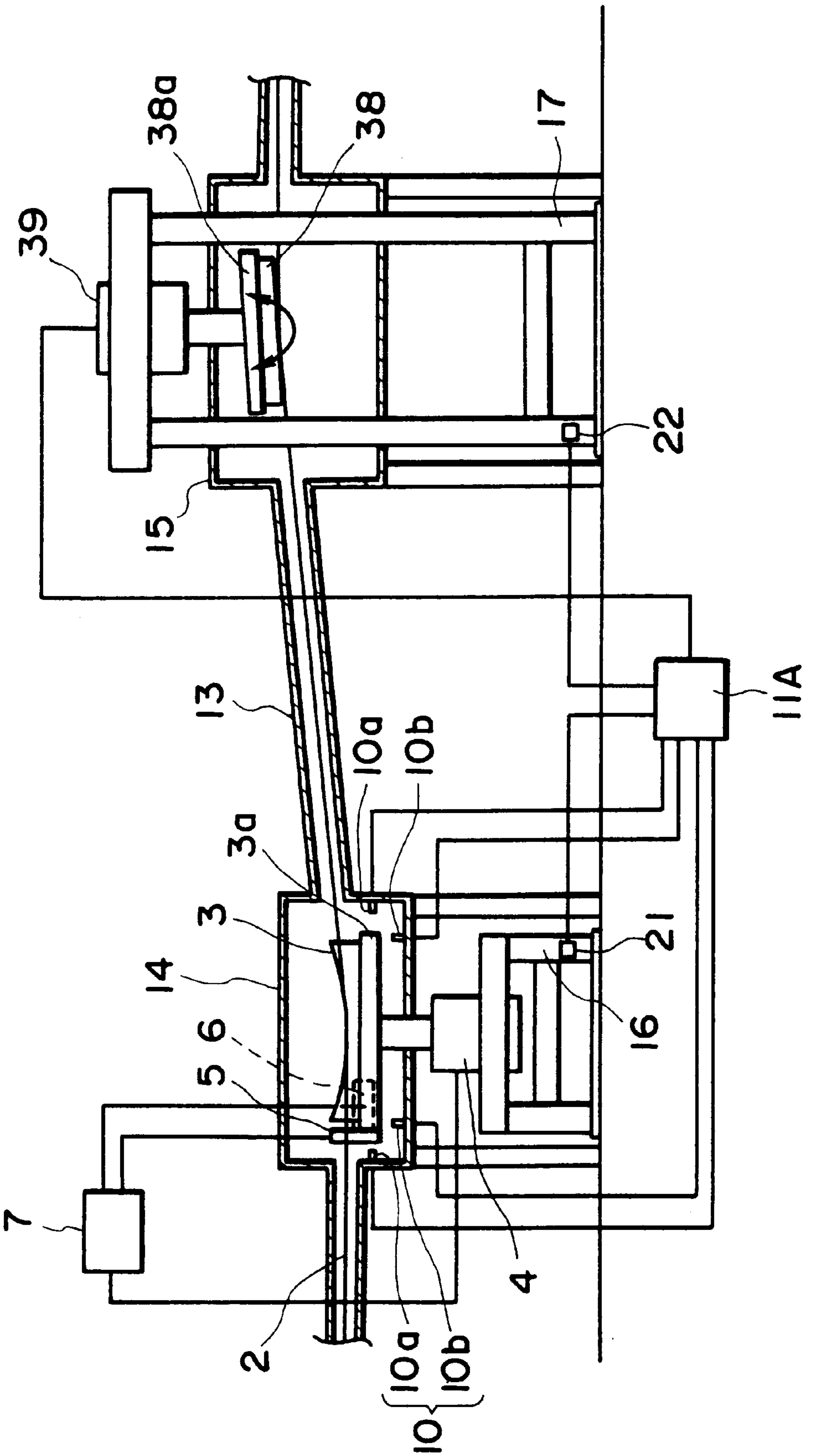
FIG. 6 is a schematic and side view, showing partly in section an X-ray illumination system according to a fourth embodiment of the present invention.

A fourth embodiment of the present invention will be described with reference to FIG. 6. Like the third embodiment, this embodiment is directed to an X-ray illumination system wherein a synchrotron radiation beam is collected in the X direction and, through swinging motion of at least one X-ray mirror by a swinging mechanism, the sheet-like synchrotron radiation beam is scanningly deflected in the Y direction so that X-rays are relatively scanned relative to an exposure picture angle, by which the whole mask surface is illuminated. It has an arrangement, in addition to the structure of the third embodiment, that a shift of relative position of the first X-ray mirror, due to floor vibration, for example, at respective X-ray mirror positions can be corrected. In this embodiment, the components similar to those of the first or third embodiment are denoted by corresponding reference numerals.

Denoted in FIG. 6 at 21 and 22 are floor vibration measuring means, as those described with reference to the second embodiment, which serve to measure floor vibration at the first X-ray mirror position and the second X-ray mirror position, respectively. The floor vibration measuring means 21 is fixedly mounted on a frame 16 for supporting the first X-ray mirror 3 and being disposed on the floor surface. The floor vibration measuring means 22 is fixedly mounted on a frame 17 for supporting the second X-ray mirror 8 and being disposed on the floor surface. The floor vibration measuring means may include an acceleration sensor, for example, for calculating amplitude from measured acceleration. Alternatively, a distance measuring sensor may be disposed in the atmosphere of the first X-ray mirror unit while a target is fixedly provided in the atmosphere of the second X-ray mirror unit, such that relative shift of the second X-ray mirror unit relative to the first X-ray mirror unit may be measured directly. Any other method may be used as the floor vibration measuring means, provided that it can measure relative positional shift of the first and second X-ray mirrors due to floor vibration.

This embodiment uses second control means 11A, in place of the second control means 11 of the third embodiment. More specifically, the second control means 11A drive controls the second driving means 39 for the second X-ray mirror 8, and it receives a measurement signal from the position/attitude measuring means 10 disposed inside the ultra-high vacuum chamber 14 for the first X-ray mirror 3 and for measuring the position and attitude of the first X-ray mirror 3. In addition to this, it receives measurement signals from the two floor vibration measuring means 21 and 22 for measuring floor vibrations at the positions of the first and second X-ray mirrors 3 and 38, respectively. On the basis of theses measurement signals, the second control means calculates relative positional displacements of the first and second X-ray mirrors 3 and 38, due to floor vibration, for example. Thus, the second control means 11A calculates the optical axis, at the second X-ray mirror 38 position, of the synchrotron radiation beam 2 having been reflected by the first X-ray mirror 3, and also calculates a drive amount for the second X-ray mirror 38 with respect to the optical axis of the synchrotron radiation beam 2. Further, it calculates relative positional deviations at respective positions from the outputs of the two floor vibration measuring means 21 and 22, and calculates deviation of the second X-ray mirror 38 relative to the first X-ray mirror 3, on the basis of which it corrects the drive amount for the second X-ray mirror 38 based on the result of measurement by the position/attitude measuring means 10. In accordance with the thus corrected drive amount, the second control means actuates the second driving means 39.

With this arrangement, in addition to the advantageous effects of the third embodiment, a relative positional displacement between the first and second X-ray mirrors 3 and 38 can be measured, and the drive amount for the second X-ray mirror 38 can be corrected. Thus, even if the relative position of the first and second X-ray mirrors 3 and 38 changes due to floor vibration, for example, the first and second X-ray mirrors 3 and 38 can be positioned precisely with respect to the synchrotron radiation beam.

Fifth Embodiment

A fifth embodiment of the present invention will be described with reference to FIGS. 7 and 8. In this embodiment, at least two X-ray mirrors are used to collect a synchrotron radiation beam in the X direction and to expand it in the Y direction, for simultaneous illumination of the whole mask surface. Also, relative position and/or attitude of a first X-ray mirror with respect to a second X-ray mirror is measured, on the basis of which the X-ray mirrors are positioned precisely with respect to the synchrotron radiation beam. Like numerals as those of the first and second embodiments are assigned to corresponding elements of this embodiment.

Figure 7:
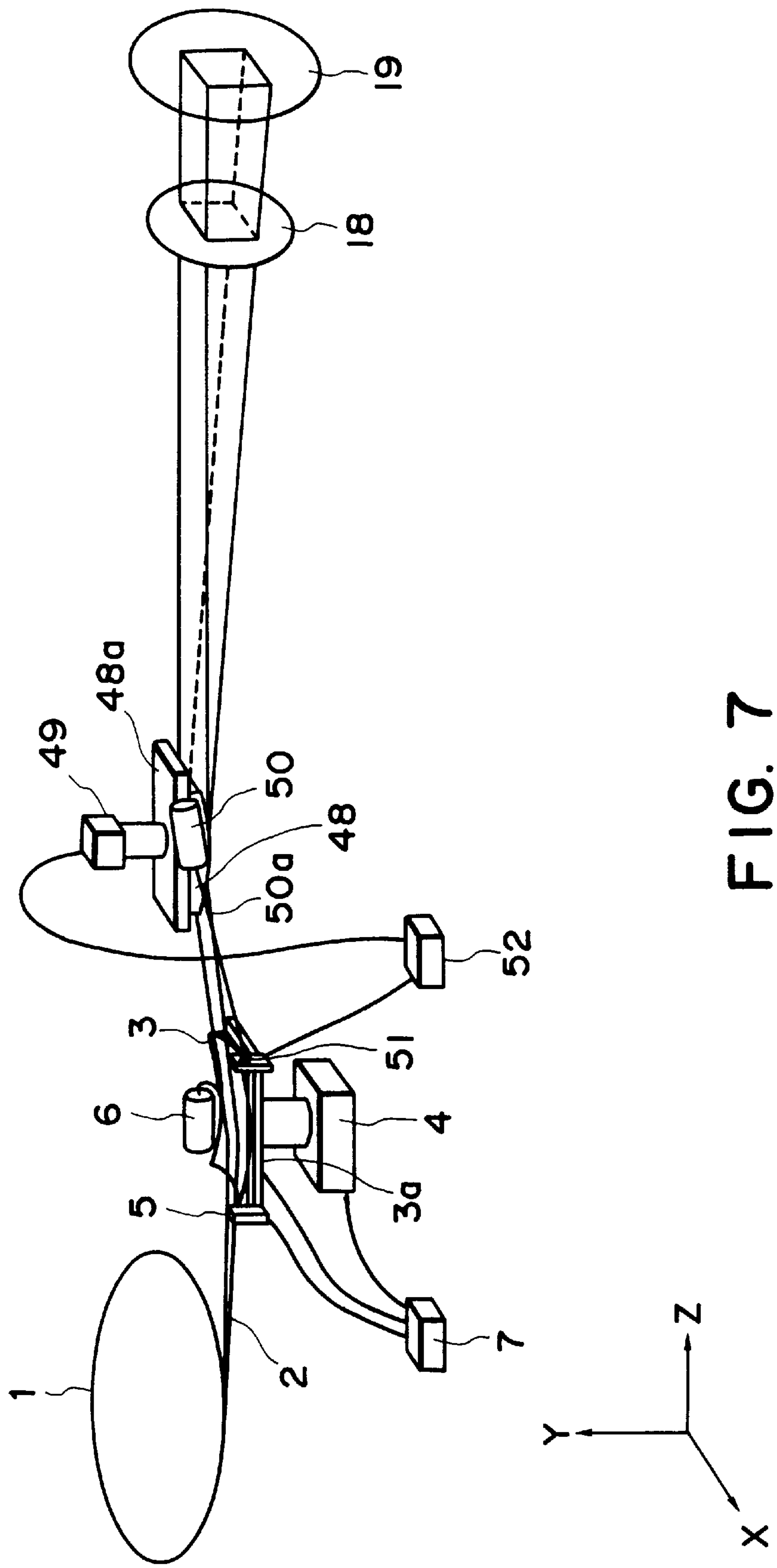
FIG. 7 is a schematic view of an X-ray illumination system according to a fifth embodiment of the present invention.
Figure 8:
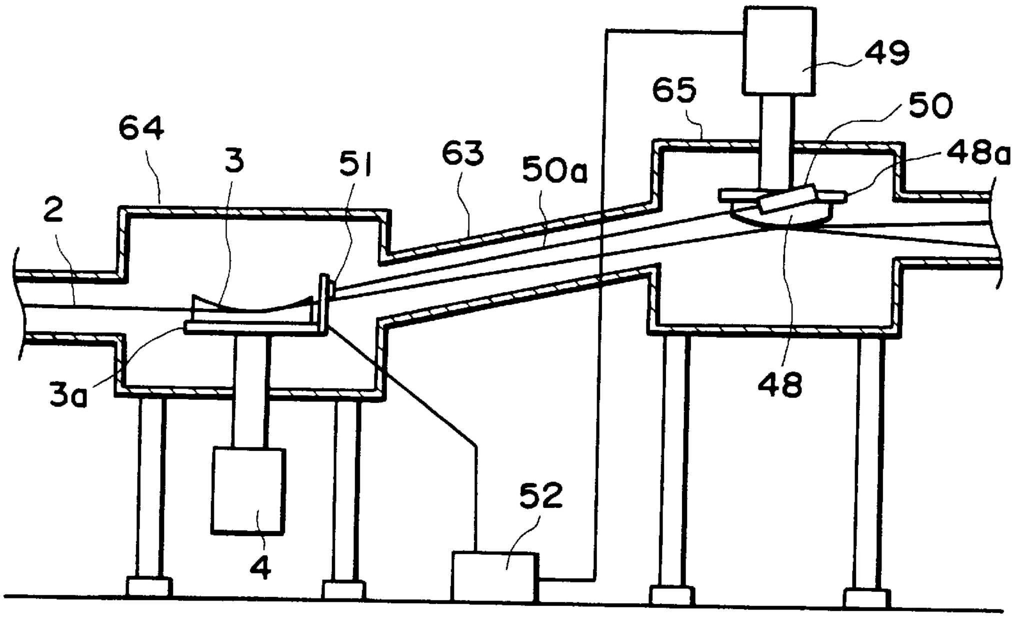
FIG. 8 is a schematic and side view, showing partly in section the X-ray illumination system of the fifth embodiment.

In FIGS. 7 and 8, the first X-ray mirror 3 comprises a light collecting mirror having a reflection surface shaped concaved in the X direction, for collecting a sheet-like synchrotron radiation beam 2 in the X direction. The mirror is held by a first mirror holder 3*a*, and the position or attitude thereof can be adjusted by first driving means 4 which is connected to first control means 7. There are an intensity sensor 5 for detecting an intensity center of the synchrotron radiation beam 2 and an optical axis sensor 6 for detecting tilt of an optical axis of the synchrotron radiation beam 2. These sensors are mounted on the first mirror holder 3*a* in a predetermined positional relation with the first X-ray mirror. The intensity sensor 5 and the optical axis sensor 6 serve to detect relative position and relative angle of the sheet-like synchrotron radiation beam 2 with respect to the first X-ray mirror 3, and they produce corresponding detection signals and apply them to the first control means 7. On the basis of these signals, the first control means 7 calculates a relative positional deviation between the first X-ray mirror 3 and the sheet-like synchrotron radiation beam 2, and produces and applies a signal to the first driving means 4 in accordance with the result of the calculation. By this, the first X-ray mirror 3 and the synchrotron radiation beam 2 can be maintained in a predetermined positional relation with each other.

The second X-ray mirror 48 comprises an expanding mirror having a reflection surface curved into a cylindrical shape, for reflecting and expanding in the Y direction the synchrotron radiation beam 2 having been collectively reflected by the first X-ray mirror 3. It is held by a second mirror holder 48*a*, and the position or attitude thereof can be adjusted by second driving means 49.

Mounted on the second mirror holder 48*a* of the second X-ray mirror 48 is a laser light source 50 which emits laser light 50*a* toward an area sensor 51 fixedly mounted as a target on the first X-ray mirror 3 side. The area sensor 51 receives the laser light 50*a* from the laser light source 50, and detects an amount or direction of displacement of the position of light reception. As shown in FIG. 8, the laser light source 50 and the area sensor 51 are disposed inside ultra-high vacuum chambers 65 and 64, respectively. Also, the laser light source 50 projects the laser light 50*a* through a beam line 63 onto the area sensor 51 which is a target. The second control means 52 receives an output of the area sensor 51 and, on the basis of this output signal, it calculates the amount of relative shift of the first X-ray mirror 3 relative to the second X-ray mirror 48. In accordance with the result of calculation, it controls the second driving means 49.

With the arrangement described above, the synchrotron radiation beam 2 emitted from the electron accumulation ring 1 impinges on the first X-ray mirror 3 and, simultaneously therewith, it impinges on the intensity sensor 5 and the optical axis sensor 6 fixed to the first mirror holder 3*a*. The intensity sensor 5 and the optical axis sensor 6 serve to detect the center of intensity of the synchrotron radiation beam 2 and tilt of the optical axis thereof. More specifically, displacement of the synchrotron radiation radiation beam 2 with respect to the X direction, the Y direction, wX direction, wY direction and wZ direction can be detected. All measured values are supplied to the first control means 7. On the basis of these measured values, the first control means 7 calculates drive amounts in relation to these axes of the first driving means 4, and actuates the first driving means 4 to control the position and attitude of the first X-ray mirror 3 with respect to the synchrotron radiation beam 2. By this, relative positional deviation between the first X-ray mirror 3 and the synchrotron radiation beam 2 can be avoided.

As regards the relative position or attitude of the first and second X-ray mirrors 3 and 48, the laser light 50*a* (measurement light beam) emitted from the laser light source 50, being mounted in relation to the second X-ray mirror 48, is received by the area sensor 51 being mounted in relation to the first X-ray mirror 3, and the position and attitude are calculated on the basis of the amount of or direction of shift of the point of light reception thereon. More specifically, a relative deviation in position or attitude between the first and second X-ray mirrors appears as a displacement of the point of reception of the laser light 50*a* upon the area sensor 51. From the amount and direction of the displacement of the light reception point, the amount of relative deviation in position and attitude between the first and second mirrors can be measured. An output of the area sensor is applied to second control means 52. On the basis of the measurement output of the area sensor 51, the second control means 52 calculates the drive amount for bringing the second X-ray mirror 48 into a predetermined position and attitude with respect to the first X-ray mirror 3. Then, the second control means actuates the second X-ray mirror 48 through the second driving means 49 to control relative position and attitude between the first and second X-ray mirrors 3 and 48. It is to be noted that the laser light source 50 may be disposed on the first X-ray mirror 3 side, and the area sensor 51 may be provided on the second X-ray mirror 48 side.

In accordance with this embodiment as described above, at least two X-ray mirrors 3 and 48 which can be driven by respective driving means 4 and 49 are provided. On the basis of the result of detection by the intensity sensor 5 and the optical axis sensor 6 fixedly mounted on the first X-ray mirror 3 side, for detecting the optical axis of the synchrotron radiation beam 2, the first X-ray mirror 3 is drive controlled so that it is constantly positioned and maintained at a predetermined position and attitude with respect to the optical axis of the synchrotron radiation beam 2. Further, there is measuring means which comprises a laser light source 50 fixedly mounted on one X-ray mirror side and an area sensor 51 fixedly mounted on the other X-ray mirror side, for measuring relative position and attitude of the first and second X-ray mirrors. On the basis of an output of these measuring means 50 and 51, second control means 52 calculates a drive amount for a subsequent (second and later) X-ray mirror or mirrors. In accordance with the thus calculated drive amount, the second control means 52 controls driving means 49 related to the corresponding mirror. Thus, on the basis of a result of measurement by the measuring means 50 and 51, a drive amount for a second or later X-ray mirror 48 is calculated, and the position and attitude of that mirror is controlled to follow displacement of the first X-ray mirror 3.

Thus, without provision of an intensity sensor or optical axis sensor for the second X-ray mirror 48, both the first X-ray mirror 3 and the second X-ray mirror 48 can be positioned precisely with respect to the synchrotron radiation beam 2. Therefore, a relative positional deviation between the first or second X-ray mirror and the synchrotron radiation beam impinging thereto can be avoided. Additionally, the first X-ray mirror can be positioned precisely with respect to the synchrotron radiation beam by use of the intensity sensor and the optical axis sensor fixedly mounted on the first X-ray mirror 3. By use of this area sensor 51 fixed to the first X-ray mirror 3 side and of the laser light source 50 fixed to the second X-ray mirror 48 side, the relative position and attitude of the first X-ray mirror 3 with respect to the second X-ray mirror can be measured. Therefore, even if the position of the X-ray mirror changes due to floor vibration, for example, the X-ray mirrors can be positioned with respect to the synchrotron radiation beam with high precision.

Since all the X-ray mirrors can be precisely positioned with respect to the synchrotron radiation beam, uniform and collected illumination light with less non-uniformness of intensity can be supplied to the whole surface within an exposure picture angle of the exposure apparatus simultaneously. Thus, exposure of less non-uniformness is assured. Improvement of the transfer precision of the X-ray exposure apparatus as well as a large increase of throughput are attainable.

Sixth Embodiment

A sixth embodiment of the present invention will be described with reference to FIG. 9.

Although this embodiment is directed to an X-ray illumination system which uses at least two X-ray mirrors, like the fifth embodiment, in this embodiment, the synchrotron radiation beam is collected in the X direction, while the sheet-like synchrotron radiation beam is scanningly deflected in the Y direction through swinging motion of at least one X-ray mirror with a swinging mechanism, to relatively scan the X-rays relative to the exposure picture angle for illumination of the whole mask surface. Like numerals as those of the first or fifth embodiment are assigned to corresponding elements of this embodiment.

Figure 9:
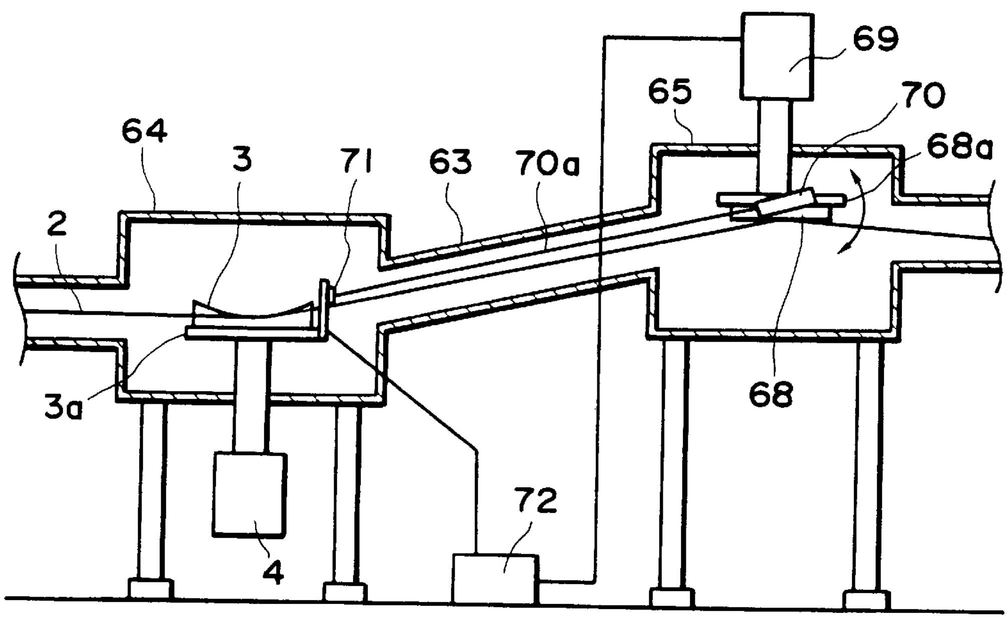
FIG. 9 is a schematic and side view, showing partly in section an X-ray illumination system according to a sixth embodiment of the present invention.

In FIG. 9, the first X-ray mirror 3 comprises a light collecting mirror having its reflection surface shaped concaved in the X direction, for collecting a sheet-like synchrotron radiation beam 2 in the X direction, like that of the fifth embodiment. It is held by a first mirror holder 3*a*, and the position or attitude thereof can be adjusted through first driving means 4 which is connected to a first control means. Also, while not shown in FIG. 9, there are an intensity sensor for detecting a center of intensity of the synchrotron radiation beam 2 and an optical axis sensor for detecting tilt of the synchrotron radiation beam 2, like those of the fifth embodiment. These sensors are mounted on the first mirror holder 3*a*, in a predetermined positional relation with the first X-ray mirror 3.

Second X-ray mirror 68 is a scan mirror which can be swingingly moved in the wX direction by a swinging mechanism, not shown, so that the synchrotron radiation beam 2 having been collectively reflected by the first X-ray mirror 3 is scanningly deflected in the Y direction. The second X-ray mirror 68 is held by a second mirror holder 68*a*, and the position or attitude thereof can be adjusted by second driving means 69. Here, control should be made so that the center of swinging motion of the second X-ray mirror 68 during a scanning exposure operation is held at a predetermined position and attitude with respect to the synchrotron radiation beam 2. To this end, the unshown swinging mechanism may preferably be disposed on the second driving means 69.

Mounted at a portion of the second mirror holder 68*a* of the second X-ray mirror 68 which is not swingingly moved by the swinging mechanism during the scan exposure operation, is a laser light source 70 for emitting laser light 70*a* toward an area sensor 71 (target) which is fixedly mounted on the first X-ray mirror 3 side. The area sensor 71 receives laser light 70*a* from the laser light source 70, and detects the amount and direction of displacement of the position of light reception. The laser light source 70*a* and the area sensor 71 are disposed within ultra-high vacuum chambers 65 and 64, respectively. The laser light source 70 projects the laser light 70*a* to the area sensor (target) 71 through a beam line 63. Second control means 72 receives an output of the area sensor 71 and, on the basis of the output signal, it calculates the amount of relative shift of the first X-ray mirror 3 with respect to the second X-ray mirror 68. Then, it controls second driving means 69 on the basis of the result of the calculation.

With the arrangement described above, the synchrotron radiation beam 2 emitted from the electron accumulation ring 1 impinges on the first X-ray mirror 3 and, simultaneously therewith, it impinges on the intensity sensor and the optical axis sensor fixed to the first mirror holder 3*a*. As has been described with reference to the fifth embodiment, these sensors serve to detect the center of intensity of the synchrotron radiation beam 2 and tilt of the optical axis thereof. More specifically, displacement of the synchrotron radiation beam 2 with respect to the X direction, the Y direction, wX direction, wY direction and wZ direction can be detected. All measured values are supplied to the first control means. On the basis of these measured values, the first control means calculates drive amounts in relation to these axes of the first driving means 4, and actuates the first driving means 4 to control the position and attitude of the first X-ray mirror 3 with respect to the synchrotron radiation beam 2. By this, relative positional deviation between the first X-ray mirror 3 and the synchrotron radiation beam 2 can be avoided.

As regards the relative position or attitude of the first and second X-ray mirrors 3 and 68, the laser light 70*a* (measurement light beam) emitted from the laser light source 70, being mounted on the second mirror holder 68*a* in relation to the second X-ray mirror 68, is received by the area sensor 71 being mounted on the first mirror holder 3*a* in relation to the first X-ray mirror 3, and the relative position or attitude of the first and second mirrors are calculated on the basis of the amount of or direction of displacement of the light reception point thereon. More specifically, a relative deviation in position or attitude between the first and second X-ray mirrors appears as a displacement of the point of reception of the laser light 70*a* upon the area sensor 71. From the amount and direction of the displacement of the light reception point, the amount of relative deviation in position and attitude between the first and second mirrors can be measured. An output of the area sensor 71 is applied to second control means 72. On the basis of the measurement output of the area sensor 71, the second control means 72 calculates the drive amount for bringing the second X-ray mirror 68 into a predetermined position and attitude with respect to the first X-ray mirror 3. Then, the second control means actuates the second X-ray mirror 68 through the second driving means 69 to control relative position and attitude between the first and second X-ray mirrors 3 and 68. It is to be noted that, as has been described with reference to the fifth embodiment, the laser light source 70 and the area sensor 71 may be provided in reversed order.

In accordance with this embodiment as described above, at least two X-ray mirrors 3 and 68 which can be driven by respective driving means 4 and 69 are provided. On the basis of the result of detection by the intensity sensor and the optical axis sensor fixedly mounted on the first X-ray mirror 3 side, for detecting the optical axis of the synchrotron radiation beam 2, the first X-ray mirror 3 is drive controlled so that it is constantly positioned and maintained at a predetermined position and attitude with respect to the optical axis of the synchrotron radiation beam 2. Further, there is measuring means which comprises a laser light source 70 fixedly mounted on one X-ray mirror side and an area sensor 71 fixedly mounted on the other X-ray mirror side, for measuring relative position and attitude of the first and second X-ray mirrors. On the basis of an output of this measuring means 70 and 71, second control means 72 calculates a drive amount for a subsequent (second and later) X-ray mirror or mirrors. In accordance with the thus calculated drive amount, the second control means 72 controls driving means 69 related to the corresponding mirror. Thus, on the basis of a result of measurement by the measuring means 70 and 71, a drive amount for a second or later X-ray mirror 68 is calculated, and the position and attitude of that mirror is controlled to follow displacement of the first X-ray mirror 3.

Thus, without provision of an intensity sensor or optical axis sensor for the second X-ray mirror 68, both the first X-ray mirror 3 and the second X-ray mirror 68 can be positioned precisely with respect to the synchrotron radiation beam 2. Therefore, a relative positional deviation between the first or second X-ray mirror and the synchrotron radiation beam impinging thereto can be avoided. Additionally, the first X-ray mirror can be positioned precisely with respect to the synchrotron radiation beam by use of the intensity sensor and the optical axis sensor fixedly mounted on the first X-ray mirror 3. By use of this area sensor 71 fixed to the first X-ray mirror 3 side and of the laser light source 70 fixed to the second X-ray mirror 68 side, the relative position and attitude of the first X-ray mirror 3 with respect to the second X-ray mirror can be measured. Therefore, even if the position of the X-ray mirror changes due to floor vibration, for example, the X-ray mirrors can be positioned with respect to the synchrotron radiation beam with high precision.

Since all the X-ray mirrors can be precisely positioned with respect to the synchrotron radiation beam, uniform and collected illumination light with less non-uniformness of intensity can be supplied to the whole surface within an exposure picture angle of the exposure apparatus simultaneously. Thus, exposure of less non-uniformness is assured. Improvement of the transfer precision of the X-ray exposure apparatus as well as a large increase of throughput are attainable.

Although in the above-described embodiments, two X-ray mirrors, that is, first and second mirrors, are used, the number of mirrors is not limited to this. The invention is applicable similarly to a structure wherein there are two second X-ray mirrors, that is, a total of three mirrors.

Seventh Embodiment

Next, an embodiment of a device manufacturing method which uses an X-ray exposure apparatus such as described above, will be explained.

Figure 10:
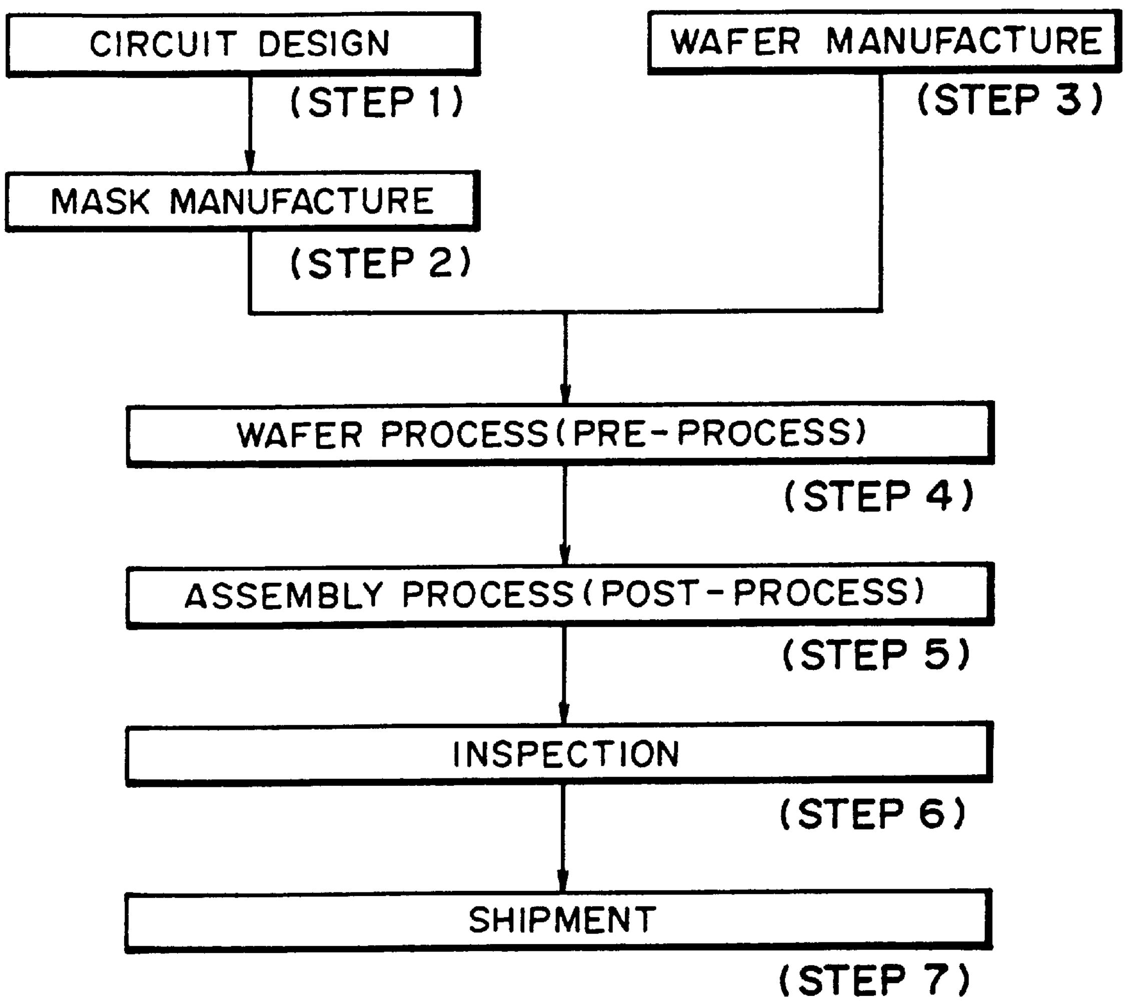
FIG. 10 is a flow chart of semiconductor device manufacturing processes.

FIG. 10 is a flow chart of a procedure for the manufacture of microdevices such as semiconductor chips (e.g., ICs or LSIs), liquid crystal panels, CCDs, thin film magnetic heads or micro-machines, for example. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process which is called a pre-process wherein, by using the so prepared mask and wafer, circuits are practically formed on the wafer through lithography. Step 5 subsequent to this is an assembling step which is called a post-process wherein the wafer having been processed by step 4 is formed into semiconductor chips. This step includes an assembling (dicing and bonding) process and a packaging (chip sealing) process. Step 6 is an inspection step wherein an operation check, a durability check and so on for the semiconductor devices provided by step 5, are carried out. With these processes, semiconductor devices are completed and they are shipped (step 7).

Figure 11:
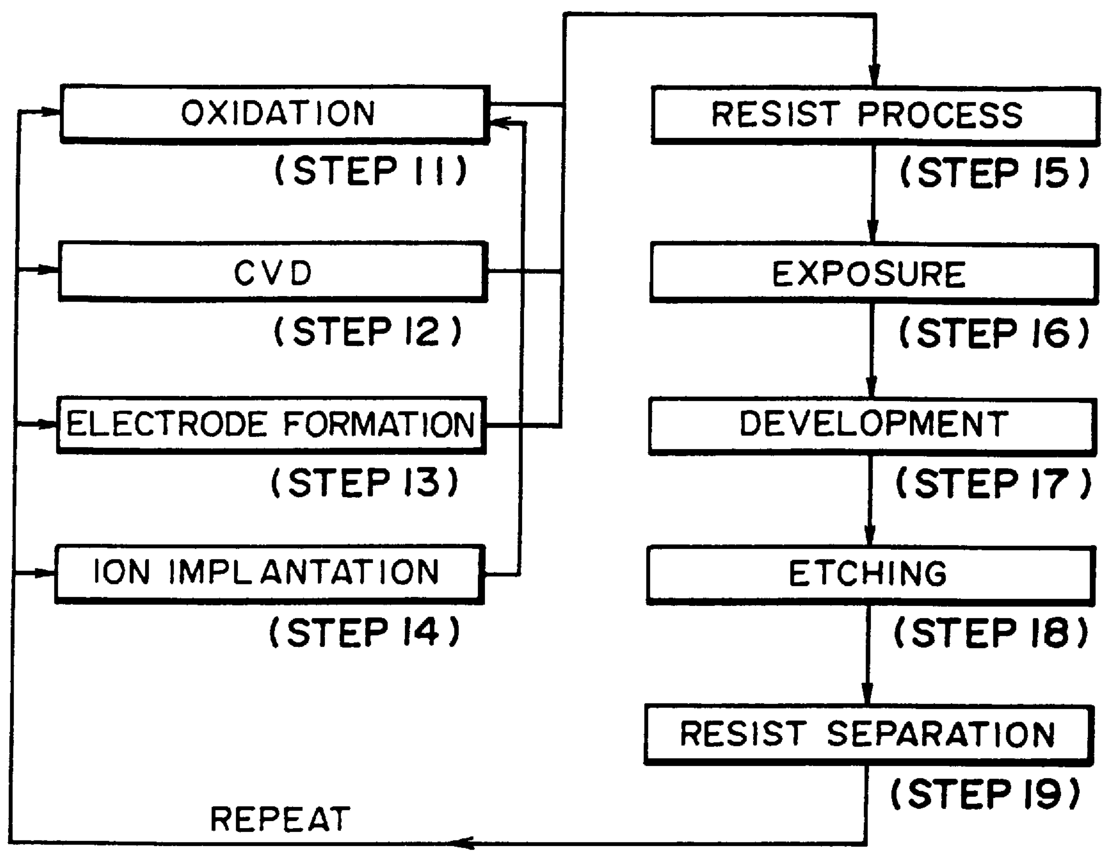
FIG. 11 is a flow chart for explaining a wafer process.
Figure 12:
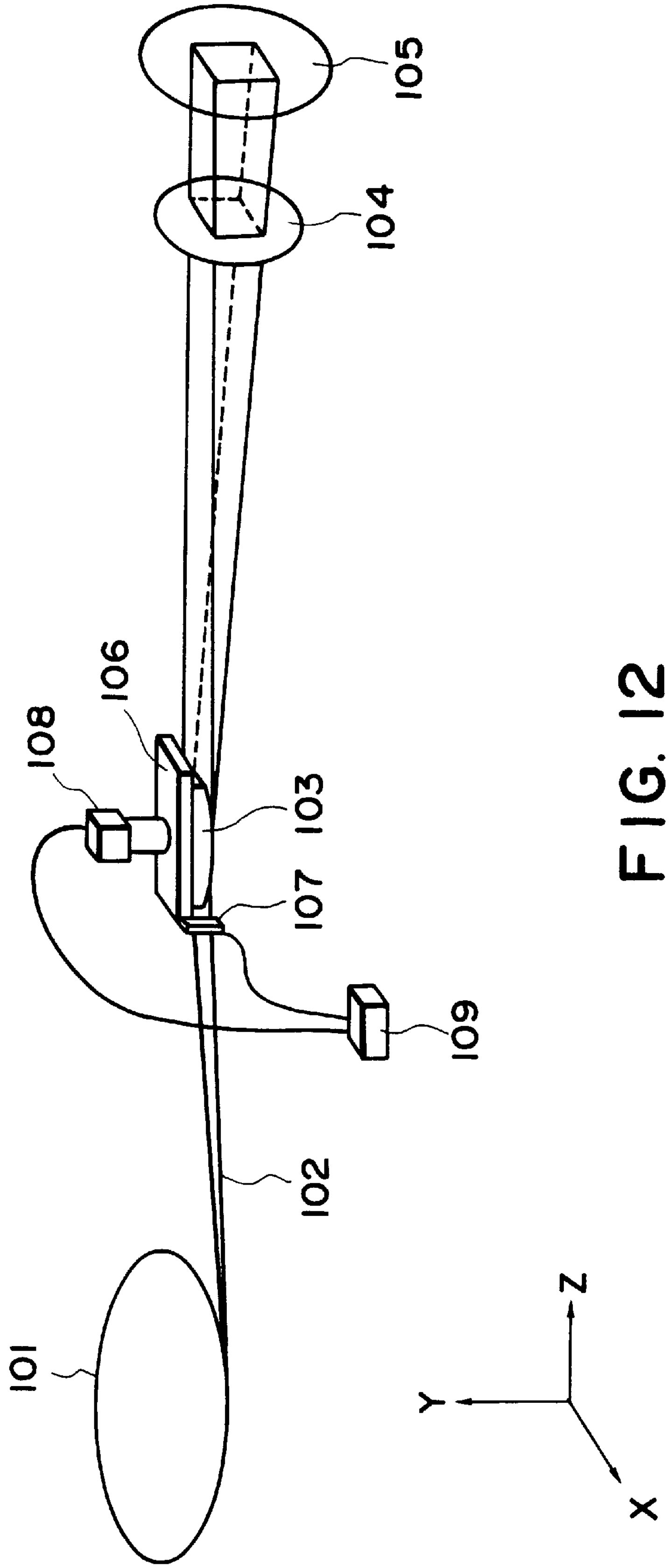
FIG. 12 is a schematic view of an example of a X-ray illumination system.
Figure 13:
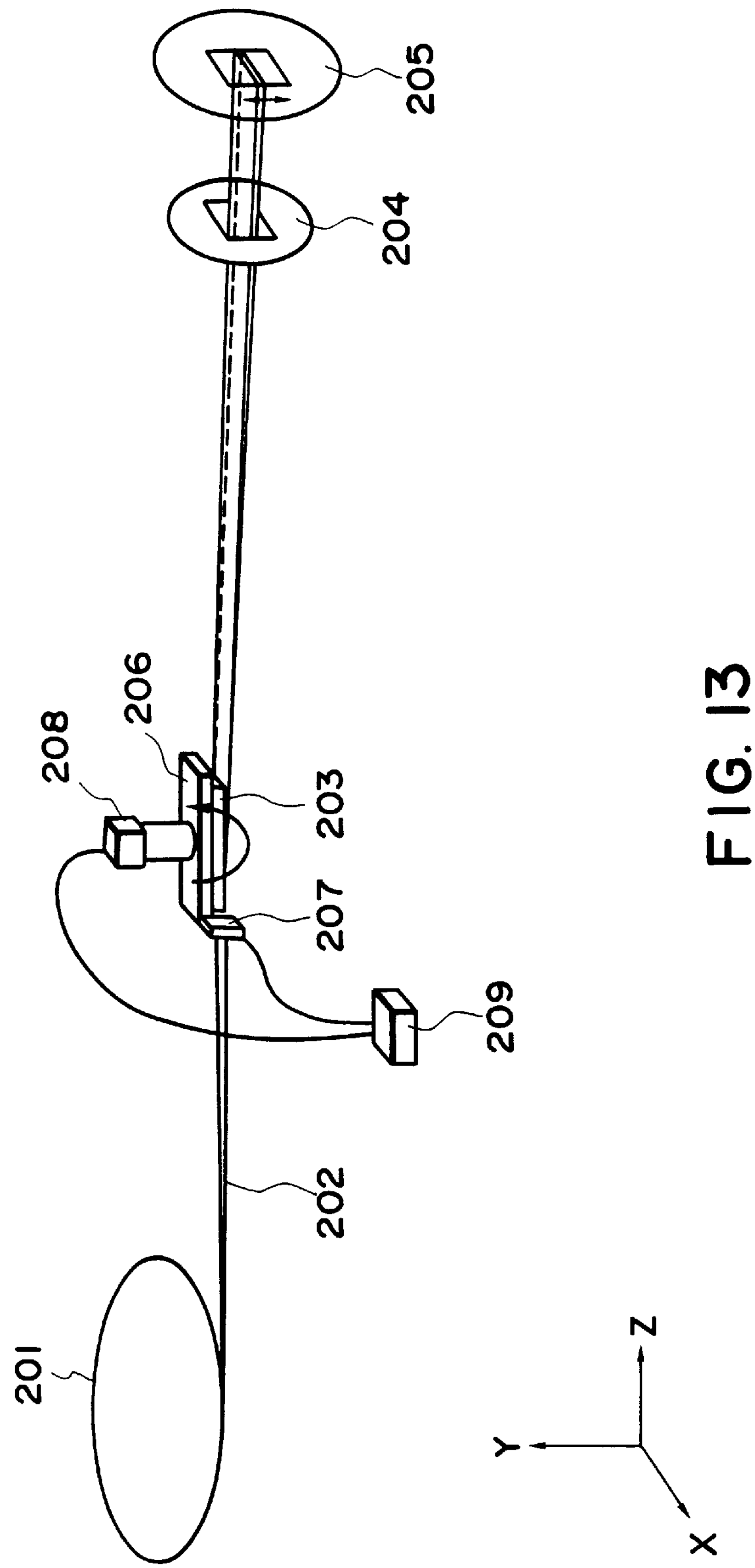
FIG. 13 is a schematic view of another example of an X-ray illumination system.

FIG. 11 is a flow chart showing details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

With these processes, high density microdevices can be manufactured.

While the invention has been described with reference to the structures disclosed herein, it is not confined to the details set forth and this application is intended to cover such modifications or changes as may come within the purposes of the improvements or the scope of the following claims.

What is claimed is:

1. An X-ray illumination system, comprising:

first and second X-ray mirrors for reflecting a synchrotron radiation beam, sequentially;

driving means for changing at least one of position and attitude of each of said first and second X-ray mirrors;

first measuring means for detecting a synchrotron radiation beam impinging on said first X-ray mirror;

second measuring means for measuring at least one of position and attitude of said first X-ray mirror with respect to a predetermined reference, or at least one of relative position and relative attitude between said first and second X-ray mirrors;

first control means for controlling drive of said first X-ray mirror on the basis of the measurement by said first measuring means; and second control means for controlling drive of said second X-ray mirror on the basis of the measurement by said second measuring means.

2. A system according to claim 1, wherein said first control means serves to maintain at least one of position and attitude of said first X-ray mirror against a displacement of the synchrotron radiation, and wherein said second control means serves to shift said second X-ray mirror in accordance with a shift of said first X-ray mirror produced by said first control means.

3. A system according to claim 1, wherein said first measuring means includes at least one of a first sensor for detecting an intensity center of the synchrotron radiation beam in the neighborhood of said first X-ray mirror, and a second sensor for detecting a tilt of an optical axis of the synchrotron radiation beam.

4. A system according to claim 1, wherein said second measuring means serves to measure position and attitude of said first X-ray mirror while taking a floor surface as a reference.

5. A system according to claim 1, further comprising third measuring means for measuring vibration, wherein control through said second control means is corrected on the basis of the measurement by said third measuring means.

6. A system according to claim 5, wherein said third measuring means includes one of a distance sensor and an acceleration sensor mounted on a frame for supporting one of said first and second X-ray mirrors.

7. A system according to claim 1, wherein said second measuring means projects a measurement light beam from a side of one of said first and second X-ray mirrors and receives the measurement light beam at a side of the other X-ray mirror.

8. A system according to claim 7, wherein said second measuring means includes a laser light source mounted on the one X-ray mirror and a sensor mounted on the other X-ray mirror.

9. A system according to claim 8, wherein said laser light source is fixedly mounted on said second X-ray mirror, and said sensor is fixedly mounted on said first X-ray mirror.

10. A system according to claim 1, wherein the synchrotron radiation beam is collected by said first X-ray mirror while it is expanded by said second X-ray mirror, by which X-rays are supplied to a predetermined illumination range at once.

11. A system according to claim 1, wherein the synchrotron radiation beam is collected by said first X-ray mirror while it is scanningly deflected with swinging motion of said second X-ray mirror, whereby X-rays are supplied to a predetermined illumination range.

12. An X-ray exposure apparatus, comprising:

an X-ray illumination system as recited in claim 1; and means for holding an article to be exposed with X-rays supplied by said X-ray illumination system.

13. A method of illuminating an object with a synchrotron radiation beam reflected by first and second X-ray mirrors sequentially, said method comprising:

a first step for maintaining at least one of position and attitude of the first X-ray mirror against a displacement of the synchrotron radiation beam; and a second step for shifting the second X-ray mirror to follow a shift of the first X-ray mirror produced in the maintaining step.

14. A method according to claim 13, wherein said second step includes detecting at least one of position and attitude of the first X-ray mirror with reference to a floor.

15. A method according to claim 13, wherein said second step includes detecting relative position between the first and second X-ray mirrors.

16. A method according to claim 13, further comprising detecting vibration of a floor on which one of the first and second X-ray mirrors is mounted, wherein a result of the detection is reflected to at least one of said first and second steps.

17. A method according to claim 13, wherein the synchrotron radiation beam is collected by the first X-ray mirror while it is expanded by the second X-ray mirror, whereby X-rays are supplied to a predetermined illumination range.

18. A method according to claim 17, wherein the synchrotron radiation beam is scanningly deflected with swinging motion of the second X-ray mirror.

19. A device manufacturing method for producing a device through a procedure which includes a process for exposing a substrate through an X-ray illumination method as recited in claim 13.

20. A method according to claim 19, wherein the procedure further includes a process for applying a resist to the substrate before the exposure process and a process for developing the resist after the exposure process.

* * * * *

UNITED STATES PATENT AND TRADEMARK OFFICE

CERTIFICATE OF CORRECTION

PATENT NO. : 6,081,581

DATED : June 27, 2000

INVENTOR(S) : TAKAYUKI HASEGAWA

It is certified that error appears in the above-identified patent and that said Letters Patent is hereby corrected as shown below:

COLUMN 1:
Line 46, "relative" should read --the relative--.

COLUMN 2:
Line 38, "shift" should read --a shift--.

COLUMN 3:
Line 64, "relative" should read --the relative--.

COLUMN 4:
Line 64, "a X-ray" should read --an X-ray--.

COLUMN 8:
Line 33, "is" should read --is a--.

COLUMN 9:
Line 36, "those" should read --those of--.

UNITED STATES PATENT AND TRADEMARK OFFICE

CERTIFICATE OF CORRECTION

PATENT NO. : 6,081,581

DATED : June 27, 2000

INVENTOR(S) : TAKAYUKI HASEGAWA

It is certified that error appears in the above-identified patent and that said Letters Patent is hereby corrected as shown below:

COLUMN 11:
Line 47, "theses" should read --these--.

COLUMN 13:
Line 61, "is" should read --is a--.

COLUMN 16:
Line 17, "is" should read --is a--.
Line 21, "this" should read --these--.

Signed and Sealed this

Tenth Day of April, 2001

Attest:

Nicholas P. Godici

NICHOLAS P. GODICI

*Attesting Officer*

*Acting Director of the United States Patent and Trademark Office*